(12) United States Patent
Chen et al.

(10) Patent No.: US 8,698,541 B2
(45) Date of Patent: Apr. 15, 2014

(54) THRESHOLD VOLTAGE DETECTION APPARATUS

(75) Inventors: Bo-Ting Chen, Fengyuan (TW); Guang-Cheng Wang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 55 days.

(21) Appl. No.: 13/029,469

(22) Filed: Feb. 17, 2011

(65) Prior Publication Data

US 2012/0212279 A1   Aug. 23, 2012

(51) Int. Cl.
*H03L 5/00*   (2006.01)

(52) U.S. Cl.
USPC .................... 327/333; 326/62; 326/81

(58) Field of Classification Search
USPC ............. 326/62–63, 80–81; 327/306, 333
See application file for complete search history.

(56) References Cited

U.S. PATENT DOCUMENTS

| | | | |
|---|---|---|---|
| 7,341,837 B2 * | 3/2008 | Lawton | 435/7.1 |
| 7,420,393 B2 * | 9/2008 | Huang et al. | 326/68 |
| 7,541,837 B2 * | 6/2009 | Lines | 326/68 |
| 2006/0279348 A1 * | 12/2006 | Woo et al. | 327/333 |
| 2008/0007301 A1 | 1/2008 | Hsin-Chu et al. | |

* cited by examiner

*Primary Examiner* — Dinh T. Le
(74) *Attorney, Agent, or Firm* — Slater & Matsil, L.L.P.

(57) ABSTRACT

A threshold voltage detection apparatus comprises a voltage level up-shifter and a voltage level down-shifter. The threshold voltage detection apparatus is placed at a circuit fabricated in a low voltage semiconductor process. The threshold voltage detection apparatus receives an input signal having a wide range and generates output signals comprising the logic of the input signal, but having a voltage range suitable for the low voltage circuit. The threshold voltage detection apparatus ensures that the low voltage circuit operates in a range to which the low voltage semiconductor process is specified.

20 Claims, 3 Drawing Sheets

THRESHOLD VOLTAGE DETECTION APPARATUS

BACKGROUND

The amount of power a central processing unit (CPU) uses is defined as the product of the voltage across the CPU and the current flowing through the CPU. The current flowing through the CPU is proportional to the speed of the CPU. As semiconductor technologies evolve, CPU devices are allowed to operate at much higher speeds. Such higher speeds cause extra power consumption. In order to reduce power consumption and heat dissipation while keeping the same CPU performance, the CPU voltage has to be reduced so that the total amount of power the CPU draws will be reduced accordingly.

At the early stage of computer development, a CPU operated from a 5 volt (V) power supply. As new CPU design and manufacturing technologies have been employed, new generation CPU devices are capable of steadily operating from a voltage as low as approximately 0.9V. Such a low supply voltage allows CPU devices to be fabricated in a 1.8V CMOS process. On the other hand, some peripheral devices such as input/output (I/O) devices still operate from a higher voltage supply (e.g., 3.3V). When a logic signal is forwarded from an I/O device to a CPU, the mismatch between the supply voltages of two devices may cause a reliability issue. More particularly, the logic signal having a high voltage (e.g., 3.3V) may exceed the maximum voltage (e.g., 1.8V) to which the CPU is specified.

Conventional voltage level shifting devices are employed to shift a voltage level up when a logic signal is forwarded from a CPU to an I/O device and shift a voltage level down when a logic signal is sent from an I/O device to a CPU. A variety of voltage level shifting devices have been adopted to convert an input voltage signal to an output voltage signal within a range suitable for a device operating from a different supply voltage. For example, a resistive divider and an operational amplifier may form a high-to-low voltage level shifter. First, the resistive divider scales the input high voltage signal down to a range suitable for the operation amplifier having a low supply voltage. The operation amplifier generates a signal having a low voltage suitable for subsequent circuits.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a threshold voltage detection apparatus. The invention may also be applied, however, to a variety of voltage level shifters operating between different supply voltage levels.

Figure 1:
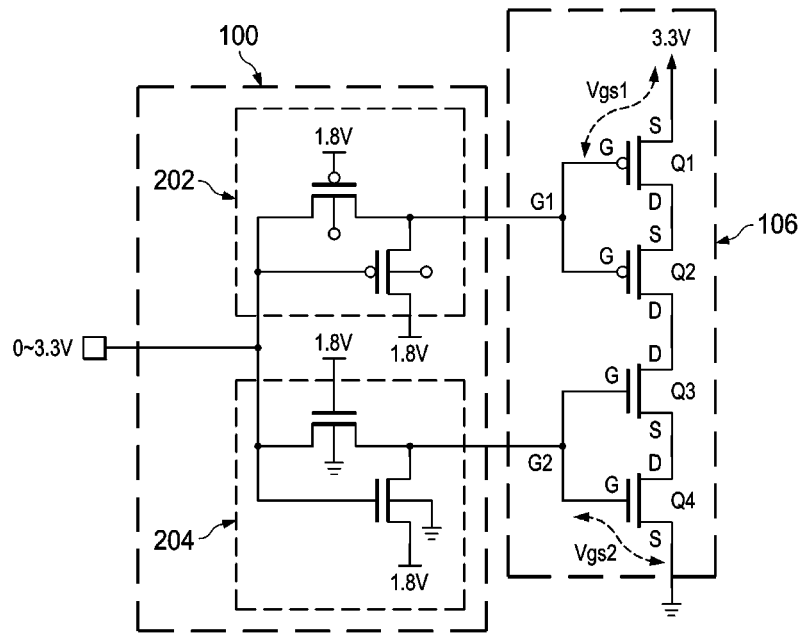
FIG. 1 illustrates a schematic diagram of a threshold voltage detection apparatus.

FIG. 1 illustrates a schematic diagram of a threshold voltage detection apparatus 100. The threshold voltage detection apparatus 100 may receive logic signals generated by other circuits (not shown) having a voltage in a range from 0V to 3.3V. The threshold voltage detection apparatus 100 is coupled to a buffer 106. The buffer 106 may be formed by four 1.8V rated high voltage (HV) transistors, namely high voltage P-type metal-oxide-semiconductor (HVPMOS) Q1, HVPMOS Q2, high voltage N-type metal-oxide-semiconductor (HVNMOS) Q3 and HVNMOS Q4. As known in the art, 1.8V rated HVMOS transistors may endure a drain-to-source voltage as high as approximately 3.3V. However, the gate of a HVMOS transistor may be damaged if the gate-to-source voltage is more than 1.8V. Therefore, the threshold voltage detection apparatus 100 is employed to limit the amplitude of the logic signals having a range from 0 to 3.3V to a range suitable for the buffer 106.

The threshold voltage detection apparatus 100 comprises a voltage level up-shifter 202 and a voltage level down-shifter 204. When a logic signal in a range from 0V to 3.3V is applied to the input of the threshold voltage detection apparatus 100, the voltage level up-shifter 202 receives the logic signal and generates an output signal having a range from 1.8V to 3.3V. More particularly, when the logic signal at the input of the voltage level up-shifter 202 is 0V, the voltage level up-shifter 202 generates a 1.8V voltage level at its output. When the logic signal at the input of the voltage level up-shifter 202 is 3.3V, the voltage level up-shifter 202 generates a 3.3V voltage level at its output. By employing the voltage level up-shifter 202, the threshold voltage detection apparatus 100 is capable of narrowing down the input signal's range from 0-3.3V to 1.8-3.3V. Likewise, the voltage level down-shifter 204 is capable of narrowing down the input signal's range from 0-3.3V to 0-1.8V. The operation of the voltage level up-shifter 202 and the voltage level down-shifter 204 will be described in detail with respect to FIG. 2.

The buffer 106 is fabricated in a 1.8V CMOS process. In other words, the gate to source voltage of each switching element of the buffer 106 is specified to operate in a voltage range from 0V to 1.8V. As shown in FIG. 1, the HVPMOS Q1 has a source connected to a 3.3V power supply and a gate G1 connected to the output of the voltage level up-shifter 202. The voltage difference between the 3.3V power supply and G1 is defined as Vgs1 representing the gate to source voltage of Q1. As discussed above with respect to the voltage level up-shifter 202, the output of the voltage level up-shifter 202 is a signal varying from 1.8V to 3.3V. As a result, Vgs1 has a range from 0V to 1.5V. Such a range ensures that the gate to source voltage of the HVPMOS Q1 is within the maximum voltage (e.g., 1.8V) to which the HVPMOS Q1 is specified.

Likewise, the voltage level down-shifter 204 converts the input signal having a range from 0V to 3.3V to a signal at G2 having a range from 0V to 1.8V. Because the source of the HVNMOS Q4 is connected to ground. The gate to source voltage of the HVNMOS Q4 varies from 0V to 1.8V. As such, the HVNMOS Q4 operates in a range to which a 1.8V device is specified. An advantageous feature of the threshold voltage detection apparatus 100 is that while the input signal from a 3.3V COMS process has a wide voltage swing, the threshold voltage detection apparatus 100 narrows the input signal down to a range suitable for devices fabricated in a 1.8V CMOS process. Such a voltage level shift provides a reliable operation of the buffer 106 as well as the subsequent circuits.

Figures 2A, 2B:
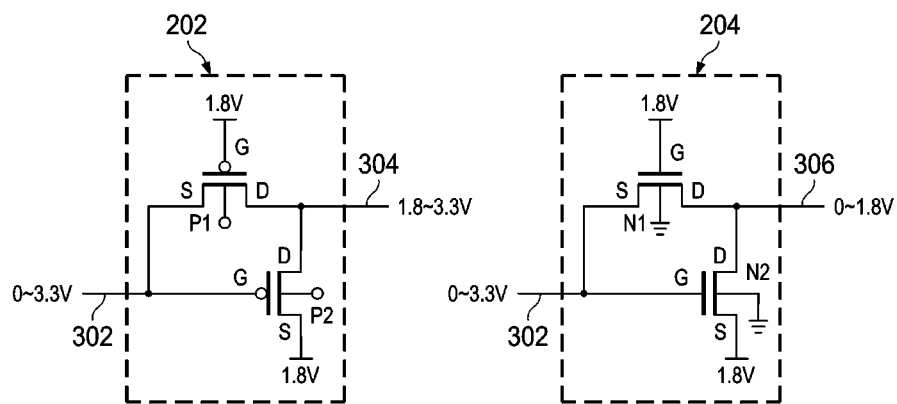
FIGS. 2A-2D illustrate detailed operation of the voltage level up-shifter and the voltage level down-shifter shown in FIG. 1.

FIGS. 2A-2D illustrate detailed operation of the voltage level up-shifter 202 and the voltage level down-shifter 204. As shown in FIG. 2A, the voltage level up-shifter 202 is formed by a first P-type metal-oxide-semiconductor (PMOS) transistor P1 and a second PMOS transistor P2. At a net 302, the source of the first PMOS transistor P1 is connected to the gate of the second PMOS transistor P2. Both the gate of the first PMOS transistor P1 and the source of the second PMOS transistor P2 are connected to a 1.8V power supply. At a net 304, the drain of the first PMOS transistor P1 is connected to the drain of the second PMOS transistor P2. In accordance with an embodiment, the net 302 receives a logic signal having a range from 0V to 3.3V. The voltage level up-shifter 202 converts the logic signal to a signal having a range from 1.8V to 3.3V at the net 304.

Figure 2C:
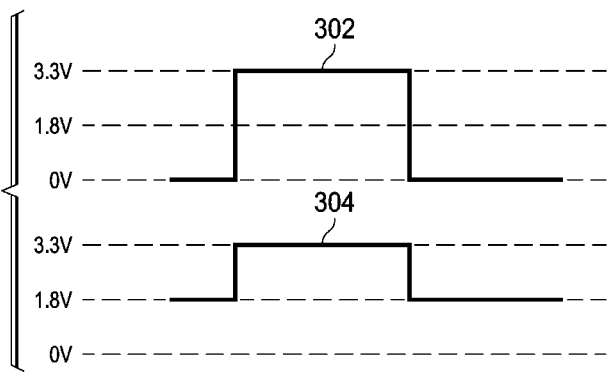

As illustrated in FIG. 2C, when a logic signal at the net 302 changes from 0V to 3.3V, the gate to source voltage of the first PMOS transistor P1 is a negative 1.8V. Such a negative 1.8V may exceed the turn-on threshold voltage of the first PMOS transistor Pl. In response to the negative 1.8V, the first PMOS transistor P1 is turned on. Similarly, the voltage change from 0V to 3.3V at the net 302 causes a positive 1.8V across the gate to source of the second PMOS transistor P2. As a result, the second PMOS transistor P2 is turned off. The turn-on of the first PMOS transistor P1 couples the net 304 with the net 302. As shown in FIG. 2C, the net 304 is of a 3.3V voltage potential after connecting to the net 302 via the first PMOS transistor P1.

When the logic signal at the net 302 changes from 3.3V to 0V, the gate to source voltage of the first PMOS transistor P1 is a positive 1.8V. Such a positive 1.8V turns off the first PMOS transistor P1 accordingly. At the same time, the gate to source voltage of the second PMOS transistor P2 becomes a negative 1.8V. Consequently, the second PMOS transistor P2 is turned on. The turn-off of the first PMOS transistor P1 isolates the net 304 from the net 302. In addition, the turn-on of the second PMOS transistor P2 pulls down the net 304 to 1.8V. In sum, the voltage level up-shifter 202 repeats the operation described above in response to the change at the net 302. As a result, the net 304 outputs a signal having a range from 1.8V to 3.3V.

FIG. 2B illustrates the schematic diagram of the voltage level down-shifter 204. A first NMOS transistor N1 and a second NMOS transistor N2 form the voltage level down-shifter 204. As shown in FIG. 2B, the source of the first NMOS transistor N1 and the gate of the second NMOS transistor N2 are connected at the net 302. Both the gate of the first NMOS transistor N1 and the source of the second NMOS transistor N2 are connected to the 1.8V power supply. The drain of the first NMOS transistor N1 and the drain of the second NMOS transistor N2 are connected at a net 306.

Figure 2D:
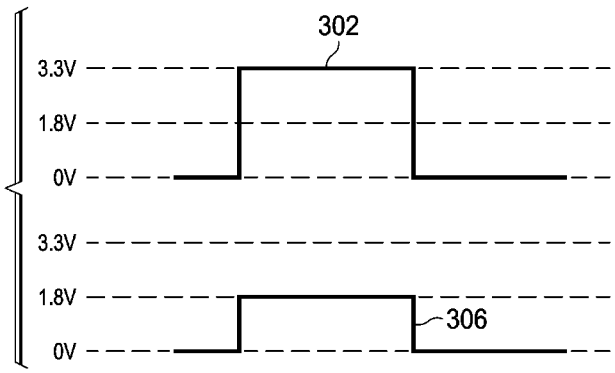

As illustrated in FIG. 2D, when a logic signal at the net 302 changes from 0V to 3.3V, the gate to source voltage of the first NMOS transistor N1 is a negative 1.8V. Such a negative 1.8V turns off the first NMOS transistor N1. Similarly, the voltage change from 0V to 3.3V at the net 302 causes a positive 1.8V across the gate to source of the second NMOS transistor N2. As a result, the second NMOS transistor N2 is turned on. The turn-on of the second NMOS transistor N2 connects the net 306 with the 1.8V power supply. As shown in FIG. 2D, the net 306 is of a 1.8V voltage potential when the input signal applied to the net 302 is 3.3V.

When the logic signal at the net 302 changes from 3.3V to 0V, the gate to source voltage of the first NMOS transistor N1 is a positive 1.8V. Such a positive 1.8V turns on the first NMOS transistor N1 accordingly. At the same time, the gate to source voltage of the second NMOS transistor N2 becomes a negative 1.8V. Consequently, the second NMOS transistor N2 is turned off. The turn-on of the first NMOS transistor N1 pulls down the net 306 to 0V. In sum, the voltage level down-shifter 202 outputs a signal having a range from 0V to 1.8V in response to the change at the net 302.

Figure 3A:
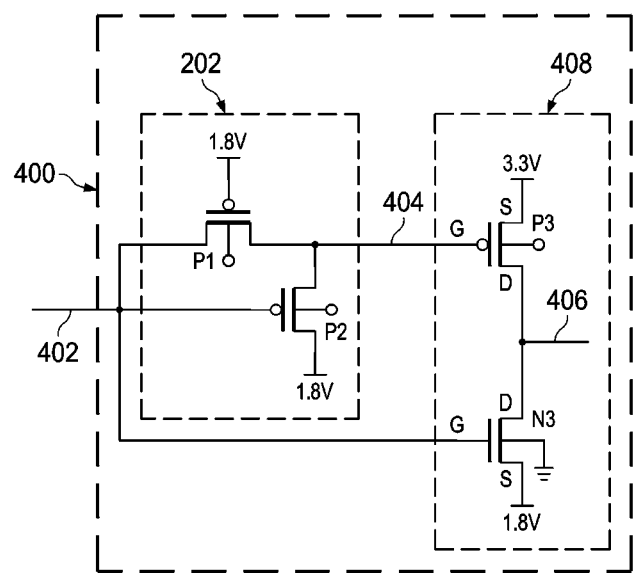
FIGS. 3A and 3B illustrate an inverting voltage level up-shifter in accordance with an alternative embodiment.
Figure 3B:
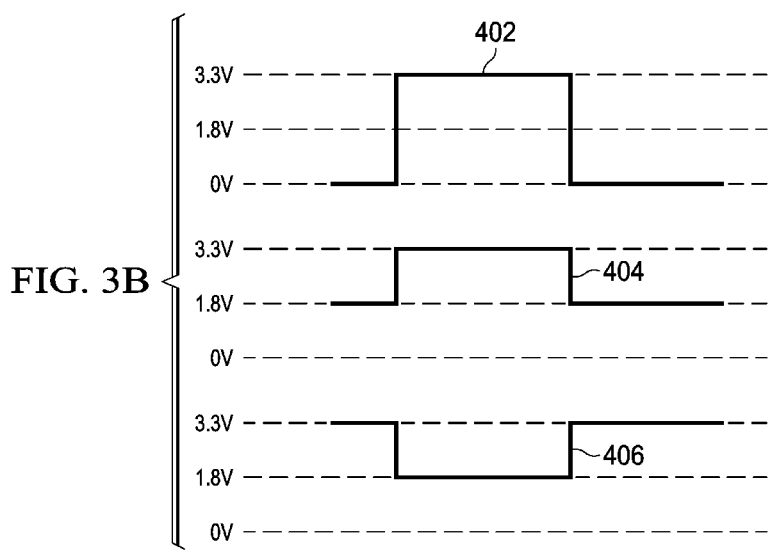

FIGS. 3A and 3B illustrate an inverting voltage level up-shifter 400 in accordance with an alternative embodiment. While the voltage level up-shifter 202 has been described above with respect to FIG. 2A, a person having ordinary skills in the art will recognize many variations, alternatives and modifications. For example, the schematic diagram illustrated in FIG. 2A may be modified in many different ways. Merely as an example, the voltage level up-shifter 202 shown in FIG. 2A may be practiced using the apparatus illustrated according to FIG. 3A. In accordance with an alternative embodiment, an inverting stage 408 may be coupled with the voltage level up-shifter 202 to form the inverting voltage level up-shifter 400.

A third PMOS transistor P3 and a third NMOS transistor N3 form the inverting stage 408. The source of the third PMOS transistor P3 is connected to a 3.3V power supply. The gate of the third NMOS transistor N3 and the gate of the third PMOS transistor P3 are connected to an input 402 and an output 404 of the voltage level up-shifter 202 respectively. The drain of the third PMOS transistor P3 is connected to the drain of the third NMOS transistor N3 at a net 406. The source of the third NMOS transistor N3 is tied to a 1.8V power supply.

As illustrated in FIG. 3B, when the input 402 changes from 0V to 3.3V, the gate to source voltage of the third NMOS transistor N3 is 1.5V, which is high enough to turn on the third NMOS transistor N3. As a result, the net 406 becomes 1.8V. On the other hand, according to the operation of the voltage level up-shifter 202, the output 404 changes from 1.8V to 3.3V. Consequently, the gate to source voltage of the third PMOS transistor P3 is 0V, which is not low enough to turn on the third PMOS transistor P3. As a result, the net 406 is isolated from the 3.3V power supply and outputs a 1.8V voltage.

Similarly, when the input 402 changes from 3.3V to 0V, the third NMOS transistor N3 is turned off because the gate to source voltage of N3 is below its threshold voltage. At the same time, the output 404 changes from 3.3V to 1.8V in accordance with the operation principle of the voltage level up-shifter 202. The gate to source voltage of the third PMOS transistor P3 is a negative 1.8V voltage, which turns on P3. The net 406 becomes 3.3V accordingly. In sum, the inverting voltage level up-shifter 400 provides the same voltage range as the voltage level up-shifter 202 but having an inverting logic. It should be noted while FIG. 3A does not provide an inverting voltage level down-shifter, a person having ordinary skills in the art will recognize that adding an inverting stage with the voltage level down-shifter 204 shown in FIG. 2B is within the scope of the present invention.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
    a voltage level up-shifter comprising all PMOS transistors and being configured to convert a signal comprising a first voltage level and a second voltage level to a first output signal on a first output port comprising the first voltage level and a third voltage level; and
    a voltage level down-shifter comprising all NMOS transistors and being configured to convert the signal to a second output signal on a second output port comprising the second voltage level and the third voltage level, wherein an input of the voltage level up-shifter and an input of the voltage level down-shifter are coupled to a same signal.

2. The apparatus of claim 1, wherein the all PMOS transistors of the voltage level up-shifter comprises:
    a first P-type metal-oxide-semiconductor (PMOS) transistor having a first gate coupled to a power supply, a first source coupled to the signal, a first drain coupled to the first output port; and
    a second PMOS transistor having a second gate coupled to the signal, a second source coupled to the power supply, a second drain coupled to the first output port.

3. The apparatus of claim 2, wherein the power supply is of an approximately 1.8V voltage potential.

4. The apparatus of claim 1, wherein the all NMOS transistors of the voltage level down-shifter comprises:
    a first N-type metal-oxide-semiconductor (NMOS) transistor having a first gate coupled to a power supply, a first source coupled to the signal, a first drain coupled to the second output port; and
    a second NMOS transistor having a second gate coupled to the signal, a second source coupled to the power supply, a second drain coupled to the second output port.

5. The apparatus of claim 1, wherein the first voltage level comprises approximately 3.3V.

6. The apparatus of claim 1, wherein the second voltage level comprises approximately 0V.

7. The apparatus of claim 1, wherein the third voltage level comprises approximately 1.8V.

8. A system comprising:
    a first circuit being configured to generate a signal varying from a first voltage level to a second voltage level;
    a threshold voltage detection apparatus coupled between the first circuit and a second circuit, wherein the threshold voltage detection apparatus comprises:
        a voltage level up-shifter comprising all PMOS transistors and being configured to convert the signal to a first output signal on a first output port comprising the second voltage level and a third voltage level; and
        a voltage level down-shifter comprising all NMOS transistors and being configured to convert the signal to a second output signal on a second output port comprising the first voltage level and the third voltage level, wherein an input of the voltage level up-shifter and an input of the voltage level down-shifter are coupled to a same signal.

9. The system of claim 8, wherein the second circuit comprise a buffer, the second circuit comprising:
    a first high-voltage P-type metal-oxide-semiconductor (HVPMOS) transistor having a first gate coupled to the first output port, a first source coupled to a power supply and a first drain;
    a second HVPMOS transistor having a second gate coupled to the first output port, a second drain, and a second source coupled to the first drain;
    a third high-voltage N-type metal-oxide-semiconductor (HVNMOS) transistor having a third gate coupled to the second output port, a third drain coupled to the second drain and a third source; and
    a fourth HVNMOS transistor having a fourth gate coupled to the second output port, a fourth drain coupled to the third source and a fourth source coupled to ground.

10. The system of claim 8, wherein the digital signal varies from 0V to 3.3V.

11. The system of claim 8, wherein the first output signal varies from 1.8V to 3.3V.

12. The system of claim 8, wherein the second output signal varies from 0V to 1.8V.

13. The system of claim 8, wherein the all NMOS transistors of the voltage level up-shifter comprises:
    a first P-type metal-oxide-semiconductor (PMOS) transistor having a first gate coupled to a first power supply, a first source coupled to the signal, a first drain coupled to the first output port; and
    a second PMOS transistor having a second gate coupled to the signal, a second source coupled to the power supply, a second drain coupled to the first output port.

14. The system of claim 13, wherein the first power supply is of an approximately 1.8V voltage potential.

15. The system of claim 13, wherein the voltage level up-shifter further comprises:
    an inverting stage comprising:
        a third PMOS transistor having a third gate coupled to the first output port, a third source coupled to a second power supply, a third drain; and
        a fourth N-type metal-oxide-semiconductor (NMOS) transistor having a fourth gate coupled to the signal, a fourth drain coupled to the third drain and a fourth source coupled to the first power supply.

16. The system of claim 15, wherein the second power supply is of an approximately 3.3V voltage potential.

17. A method comprising:
    receiving a signal varying from a first voltage level to a second voltage level;
    a voltage level up-shifter comprising all PMOS transistors and converting the signal to a first output signal on a first output port varying from a third voltage level to the second voltage level; and
    a voltage level down-shifter comprising all NMOS transistors and converting the signal to a second output signal on a second output port varying from the first voltage level to the third voltage level, wherein an input of the voltage level up-shifter and an input of the voltage level down-shifter are coupled to a same signal.

18. The method of claim 17, wherein the first output signal is at the second voltage level when the signal is at the second voltage level and the first output signal is at the third voltage level when the signal is at the first voltage level, wherein the second output signal is at the third voltage level when the signal is at the second voltage level and the second output signal is at the first voltage level when the signal is at the first voltage level.

19. The method of claim 17, further comprising:
forwarding the first output signal to a first gate of a buffer wherein the first gate and a first source of the buffer are configured such that:
   a first gate-to-source voltage across the first gate and the first source is less than a maximum voltage to which the buffer is specified; and
forwarding the second output signal to a second gate of the buffer wherein the second gate and a second source of the buffer are configured such that:
   a second gate-to-source voltage across the second gate and the second source is less than the maximum voltage to which the buffer is specified.

20. The method of claim 17, further comprising:
forwarding the first output signal to a first input of an inverting stage;
forwarding the signal to a second input of the inverting stage; and
generating an inverting signal, wherein the inverting signal is at the third voltage level when the signal is at the second voltage level and the inverting signal is at the second voltage level when the signal is at the first voltage level.

* * * * *